United States Patent
Lee et al.

(10) Patent No.: US 9,343,400 B2
(45) Date of Patent: *May 17, 2016

(54) DUAL DAMASCENE GAP FILLING PROCESS

(71) Applicant: Taiwan Semiconductor Manufacturing Company, Ltd., Hsin-Chu (TW)

(72) Inventors: Hsiang-Huan Lee, Jhudong Township (TW); Shau-Lin Shue, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 13/802,100

(22) Filed: Mar. 13, 2013

(65) Prior Publication Data

US 2014/0264908 A1    Sep. 18, 2014

(51) Int. Cl.
*H01L 21/47* (2006.01)
*H01L 21/30* (2006.01)
*H01L 21/31* (2006.01)
(Continued)

(52) U.S. Cl.
CPC ...... *H01L 23/49827* (2013.01); *H01L 21/7682* (2013.01); *H01L 21/76834* (2013.01); *H01L 21/76852* (2013.01); *H01L 21/76867* (2013.01); *H01L 21/76885* (2013.01); *H01L 23/528* (2013.01); *H01L 23/5226* (2013.01); *H01L 23/532* (2013.01); *H01L 23/5329* (2013.01);
(Continued)

(58) Field of Classification Search
CPC ....... H01L 23/48; H01L 21/44; H01L 21/768; H01L 21/28; H01L 23/53; H01L 2924/01079; H01L 2924/14; H01L 23/5226

USPC ............. 257/774, 751, E21.584, E21.577, 257/E21.175; 438/653, 294, 597
See application file for complete search history.

(56) References Cited

U.S. PATENT DOCUMENTS 5,164,332 A * 11/1992 Kumar ................ H01L 23/5283
257/E23.152
6,252,290 B1 * 6/2001 Quek ................ H01L 21/76807
257/522

(Continued)

OTHER PUBLICATIONS

T. Usui et al., "High Performance Ultra Low-k (k=2.0/keff=2.4)/Cu Dual-Damascene Interconnect Technology with Self-Formed MnSixOy Barrier Layer for 32 nm-node," SoC Research and Development Center, Semiconductor Company, Toshiba Corporation.*

(Continued)

*Primary Examiner* — Yuanda Zhang
*Assistant Examiner* — Sheikh Maruf
(74) *Attorney, Agent, or Firm* — Slater Matsil, LLP

(57) ABSTRACT

A method of forming a metallization layer in a semiconductor substrate includes forming a patterned dielectric layer on a substrate, the patterned dielectric layer having a plurality of first openings. A first conductive layer is formed in the plurality of first openings. A patterned mask layer is formed over portions of the first conductive layer outside the plurality of first openings, the patterned mask layer having a plurality of second openings, wherein at least a subset of the second openings are disposed over the first openings. A second conductive layer is filled in the plurality of second openings. The patterned mask layer is removed to leave behind the conductive layer structures on the substrate. The substrate is heated to form a self-forming barrier layer on the top and sidewalls of the conductive layer structures.

20 Claims, 4 Drawing Sheets

(51) Int. Cl.
*H01L 23/498* (2006.01)
*H01L 23/522* (2006.01)
*H01L 23/528* (2006.01)
*H01L 23/532* (2006.01)
*H01L 21/768* (2006.01)

(52) U.S. Cl.
CPC ... *H01L 23/53223* (2013.01); *H01L 2924/0002* (2013.01)

(56) References Cited

U.S. PATENT DOCUMENTS

| | | | | |
|---|---|---|---|---|
| 6,423,629 | B1* | 7/2002 | Ahn | H01L 21/7682 257/E21.581 |
| 6,503,835 | B1* | 1/2003 | Lee | H01L 21/76834 257/E21.576 |
| 8,569,165 | B2* | 10/2013 | Gordon | C23C 16/18 257/E21.575 |
| 8,835,304 | B2* | 9/2014 | Lu | H01L 21/76885 438/619 |
| 2001/0055840 | A1* | 12/2001 | Verret | 438/142 |
| 2004/0142561 | A1* | 7/2004 | Wu et al. | 438/687 |
| 2004/0232552 | A1* | 11/2004 | Wang | H01L 21/76807 257/758 |
| 2006/0046456 | A1* | 3/2006 | An | H01L 21/2885 438/597 |
| 2007/0273027 | A1* | 11/2007 | Hwang et al. | 257/758 |
| 2008/0124917 | A1* | 5/2008 | Oh et al. | 438/637 |
| 2008/0142974 | A1* | 6/2008 | Arakawa | 257/754 |
| 2008/0146015 | A1* | 6/2008 | Usui | H01L 21/76831 438/608 |
| 2008/0213998 | A1* | 9/2008 | Nagai | C23C 14/14 438/653 |
| 2009/0117731 | A1* | 5/2009 | Yu | H01L 21/76831 438/627 |
| 2009/0134517 | A1* | 5/2009 | Usui | H01L 21/7682 257/751 |
| 2010/0029076 | A1* | 2/2010 | Daamen | H01L 21/76808 438/637 |
| 2010/0099254 | A1* | 4/2010 | Narushima | C23C 16/44 438/668 |
| 2010/0155940 | A1* | 6/2010 | Kawashita et al. | 257/737 |
| 2010/0181671 | A1* | 7/2010 | Park | H01L 21/28562 257/751 |
| 2011/0006429 | A1* | 1/2011 | Liu et al. | 257/751 |
| 2011/0006430 | A1* | 1/2011 | Jourdan et al. | 257/751 |
| 2011/0049718 | A1* | 3/2011 | Matsumoto | C23C 16/40 257/751 |
| 2011/0073997 | A1* | 3/2011 | Leuschner et al. | 257/621 |
| 2012/0132967 | A1* | 5/2012 | Andry | H01L 21/76898 257/288 |
| 2012/0261788 | A1* | 10/2012 | Lin | H01L 21/31127 257/506 |
| 2013/0285257 | A1* | 10/2013 | Lee | H01L 24/03 257/774 |
| 2014/0065818 | A1* | 3/2014 | Lu et al. | 438/653 |
| 2014/0273434 | A1* | 9/2014 | Peng | H01L 21/76841 438/643 |

OTHER PUBLICATIONS

T. Usui et al., "Highly Reliable Copper Dual-Damascene Interconnects With Self-Formed MnSixOy Barrier Layer" IEEE Transactions on Electron Devices, vol. 53, No. 10, Oct. 2006.*

* cited by examiner

DUAL DAMASCENE GAP FILLING PROCESS

BACKGROUND

Modern day integrated chips contain millions of semiconductor devices. The semiconductor devices are electrically connected by way of back-end-of-the-line metallization layers that are formed above the devices on an integrated chip. A typical integrated chip comprises a plurality of back-end-of-the-line metallization layers including different sized metal conductors vertically coupled together with metal contacts (e.g., vias).

Back-end-of-the-line metallization layers are often formed using a dual damascene process. In a dual damascene process, a dielectric material is deposited (e.g., low-k dielectric, ultra low-k dielectric) onto the surface of a semiconductor substrate. The dielectric material is then selectively etched to form openings in the dielectric material for a via layer and for an adjoining metal layer. In a typical via-first dual damascene process, a via hole is first etched through two dielectric layers separated by an etch stop layer. A metal line trench is then formed on top of the via hole. After the via and trench are formed, a diffusion barrier layer and a seed layer are deposited within the openings. An electro-chemical plating process is then used to fill the via and metal trenches with metal (e.g., copper) at the same time. Finally, the surface of the substrate is planarized using a chemical mechanical polishing process to remove any excess metal.

As semiconductor device sizes continue to shrink, the dual damascene process will see a number of potential problems that may affect the quality of the metallization layers. For example, in a 20-nanometer (nm) fabrication process, the openings may become too narrow and thus may not be properly filled by conventional dual damascene processes. The top portion of the opening may be blocked, which may create a void underneath that may degrade the performance of the semiconductor device. This problem is particularly acute in high aspect ratio features of small width.

Another problem often seen with dual damascene processes is that etching may damage the dielectric material during a photoresist stripping (e.g., damage to the dielectric trench sidewalls). Such etching defects may result in voids or pit defects that negatively affect the reliability of the metallization layers.

BRIEF DESCRIPTION OF DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having an ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
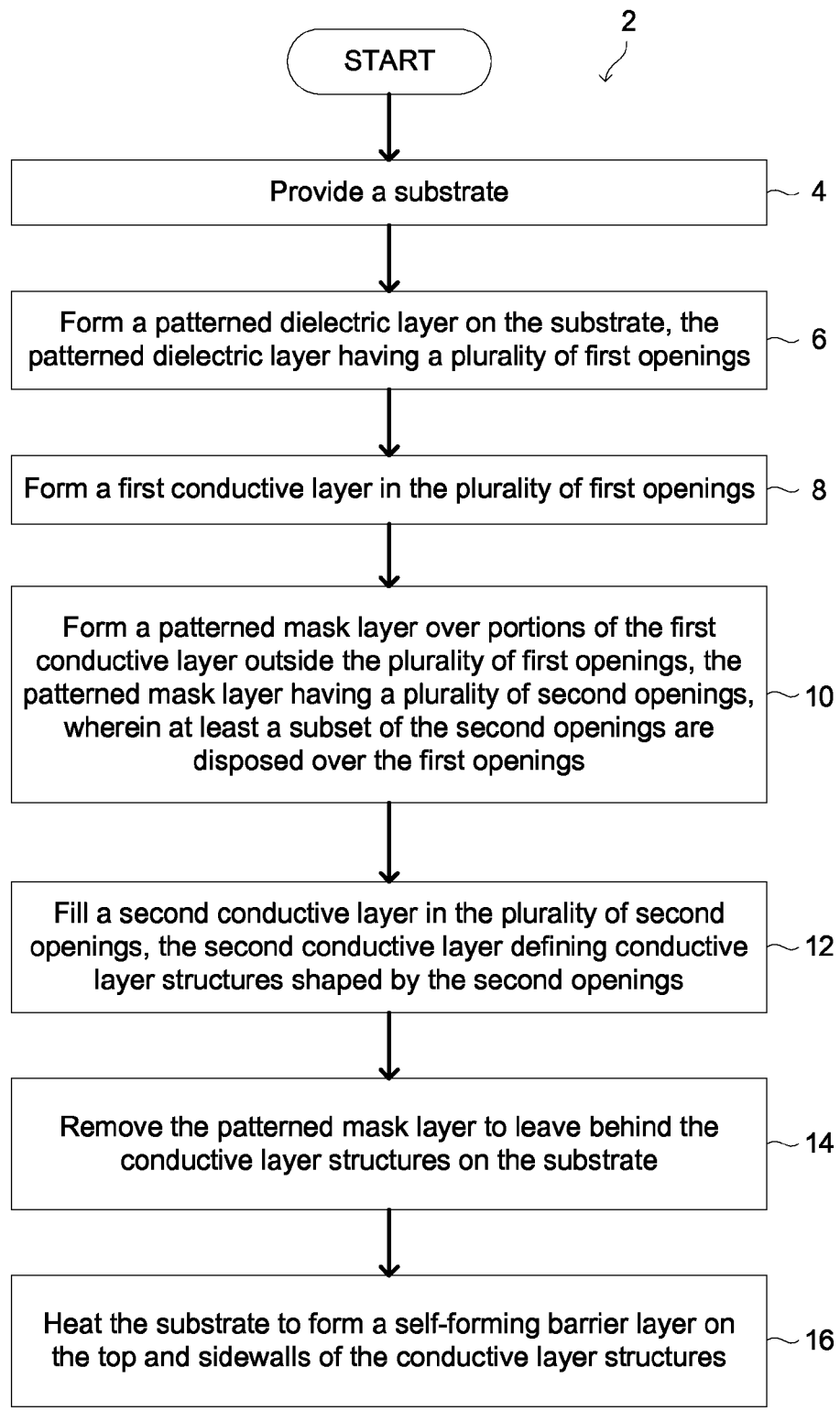
FIG. 1 is a flowchart of a method of fabricating a semiconductor device according to various embodiments of the present disclosure.

FIG. 1 is a flowchart of a method 1 for fabricating a metallization layer in a semiconductor device according to various aspects of the present disclosure. Referring to FIG. 1, the method 1 includes block 4, in which a semiconductor substrate is provided. The method 1 includes block 6, in which a patterned dielectric layer is formed on the substrate. The patterned dielectric layer has a plurality of first openings. The method 1 includes block 8, in which a first conductive layer is formed in the plurality of first openings. The method 1 includes block 10, in which a patterned mask layer is formed over portions of the first conductive layer outside the plurality of first openings. The patterned mask layer has a plurality of second openings, wherein at least a subset of the second openings are disposed over the first openings. The method 1 includes block 12, in which a second conductive layer is filled in the plurality of second openings, the second conductive layer defining conductive layer structures shaped by the second openings. The method 1 includes block 14, in which the patterned mask layer is removed to leave behind the conductive layer structures on the substrate. The method 1 includes block 16, in which the substrate is heated to form a self-forming barrier layer on the top and sidewalls of the conductive layer structures.

It is understood that additional processes may be performed before, during, or after the blocks 4-16 shown in FIG. 1 to complete the fabrication of the semiconductor device, but these additional processes are not discussed herein in detail for the sake of simplicity.

FIGS. 2-9 are diagrammatic cross-sectional side views of an embodiment of a semiconductor device at various stages of fabrication. It is understood that FIGS. 2-9 have been simplified for a better understanding of the inventive concepts of the present disclosure. It should be appreciated that the materials, geometries, dimensions, structures, and process parameters described herein are exemplary only, and are not intended to be, and should not be construed to be, limiting to the invention claimed herein. Many alternatives and modifications will be apparent to those skilled in the art, once informed by the present disclosure.

Figure 2:
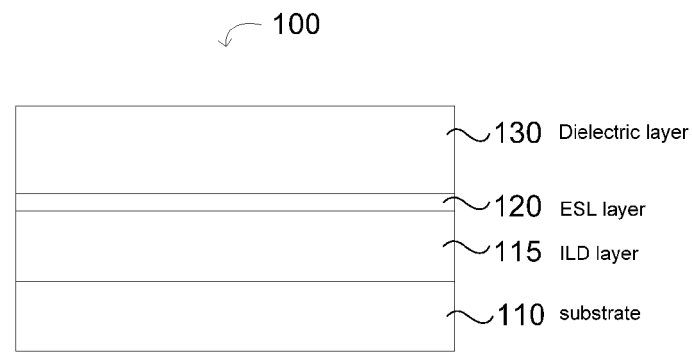
FIGS. 2-9A/B are diagrammatic cross-sectional side views of a semiconductor device at various stages of fabrication in accordance with various embodiments of the present disclosure.

Referring to FIG. 2, a semiconductor device 100 is provided. The semiconductor device 100 maybe an integrated circuit (IC) chip, system on chip (SoC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. The semiconductor device 100 includes a substrate 110. The substrate 110 may be a portion of a semiconductor wafer. For example, the substrate may include silicon. The substrate 110 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. In one embodiment, the substrate 110 includes various doped features for various microelectronic components, such as a complementary metal oxide semiconductor field-effect transistor (CMOSFET), imaging sensor, memory cell, and/or capacitive element.

An interlayer dielectric (ILD) layer 115 is formed on the substrate 110. The ILD layer 115 includes a dielectric material, for example undoped silicate glass (USG) or phosphosilicate glass (PSG). The ILD layer 115 may include other suitable materials.

A conductive layer (not shown) is formed over the ILD layer 115. The conductive layer may also be referred to as a metal layer and includes a conductive material. In an embodiment, the conductive material is copper.

An etch stop layer 120 is formed over the conductive layer. The etch stop layer 120 includes a dielectric material. In an embodiment, the etch stop layer 120 includes a compound made of a subset of the following elements: Si, O, C, N, and B. For example, the compound may be silicon nitride, silicon carbide, or silicon oxide. In one embodiment, the etch stop layer 120 has a thickness that is less than about 1,000 Angstroms.

A dielectric layer 130 is formed over the etch stop layer 120. The dielectric layer 130 includes a low-k material in an embodiment, for example, a compound made of a subset of the following elements: Si, O, C, and H. For example, the compound may be silicon oxide or silicon carbide. In an embodiment, the dielectric layer 130 has a thickness that is less than about 5,000 Angstroms.

Figure 3:
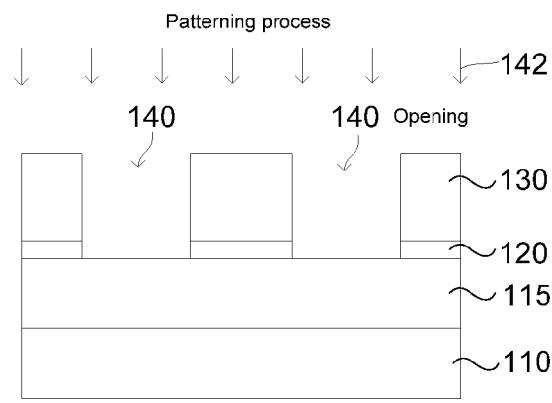

Referring now to FIG. 3, a patterning process 142 is performed on the semiconductor device 100 to form a plurality of openings 140 in the dielectric layer 130 and the etch stop layer 120. The patterning process 142 may include forming a patterned photoresist layer (not illustrated) using a process such as photolithography, immersion lithography, ion-beam writing, or other suitable processes. For example, the photolithography process may include spin-coating, soft-baking, exposure, post-baking, developing, rinsing, drying, and other suitable processes. The patterning process 142 may also include an etching process in which the patterned photoresist layer may be used as a mask to etch openings in the dielectric layer 130 and the etch stop layer 120.

For the sake of simplicity, only two openings 140 are illustrated herein, though it is understood that many other openings are formed. Each of the openings 140 is approximately aligned (vertically) with a respective one of a portion of the conductive layer.

Figure 4:
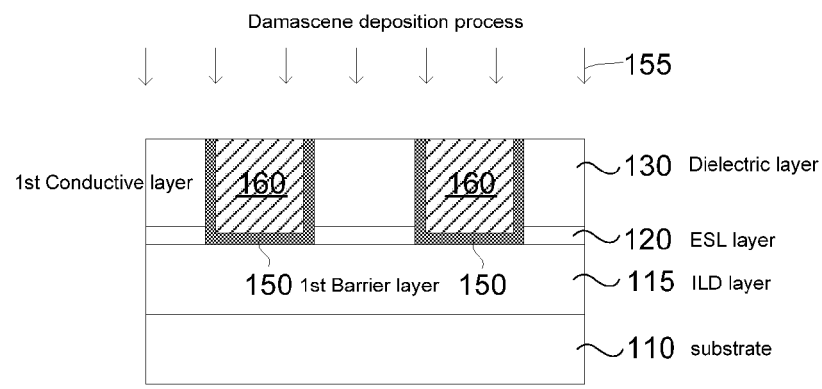

Referring now to FIG. 4, a deposition process is performed to form a diffusion barrier layer 150 over the dielectric layer 130. The diffusion barrier layer 150 is formed on the bottom and sidewalls of the dielectric layer 130 in the openings 140 and portions of the etch stop layer 120. The diffusion barrier layer 150 blocks diffusion of metal layer structures into adjacent dielectric material. In an embodiment, the deposition process includes a chemical vapor deposition (CVD) process. In another embodiment, the deposition includes an atomic layer deposition (ALD) process. The diffusion barrier layer 150 includes a conductive material. In an embodiment, the conductive material is selected from the group consisting of: tantalum (Ta), tantalum nitride (TaNx), titanium (Ti), titanium nitride (TiNx), manganese oxide (Mn Ox), and combinations thereof. In an embodiment, the diffusion barrier layer 150 has a thickness that is less than about 150 Angstroms.

Still referring to FIG. 4, a damascene deposition process 155 is performed on the semiconductor device 100. The damascene deposition process 155 deposits a conductive material in the openings 140 of the dielectric layer 130. In one embodiment, the conductive material is copper. In one embodiment, the damascene process 155 includes an electroless deposition (ELD) process. In another embodiment, the damascene deposition process 155 includes an electroplating process (ECP). A chemical mechanical polishing (CMP) process is subsequently performed after the damascene deposition process 155. As a result of the damascene process and the subsequent CMP process, a plurality of conductive layers or vias 160 are formed in the openings 140.

Figure 5:
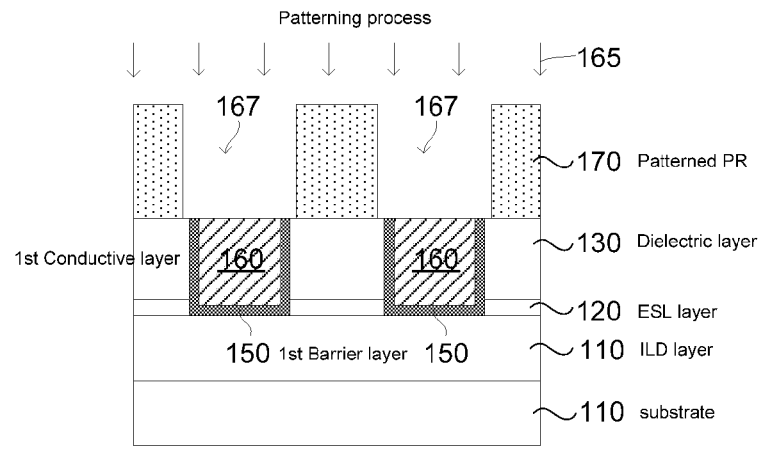

Referring now to FIG. 5, a patterning process 165 is performed on the semiconductor device 100 to form a trench mask layer 170 over portions of the vias 160. In one embodiment, the trench mask layer 170 includes a photoresist material, which is patterned using a photolithography process similar to that discussed above with reference to FIG. 3. In another embodiment, the trench mask layer 170 includes a dielectric material, for example silicon oxide, which can be patterned by a patterned photoresist layer. The formation of the trench mask layer 170 in effect creates a plurality of additional openings 167. Each of the plurality of openings 167 are disposed over (and aligned with) a respective one of the plurality of the openings 140. The openings 167 may also be referred to as trenches. In the illustrated embodiment, the openings 167 are wider than the openings 140. The openings 167 are reserved for the formation of metal line components in a later process.

Figure 6:
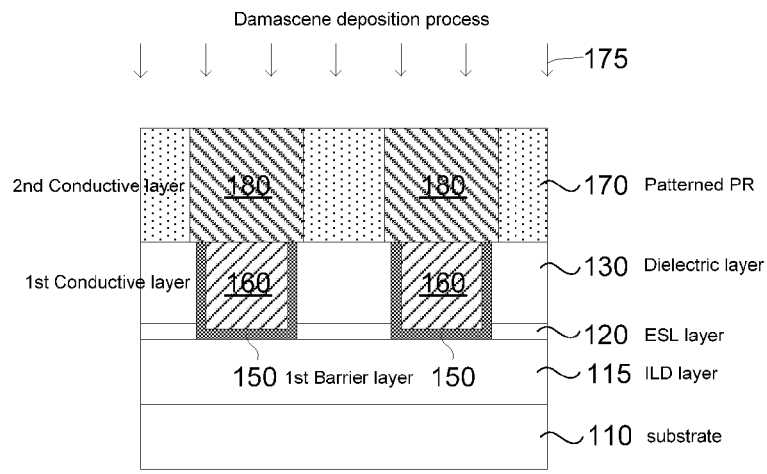

With reference to FIG. 6, a damascene deposition process 175 is performed on the semiconductor device 100. The damascene deposition process 175 deposits a conductive material in the openings 167 of the trench mask layer 170. In one embodiment, the damascene deposition process 175 includes an electroless copper bottom-up fill process. In the electroless copper bottom-up fill process, the process includes contacting the plurality of openings 167 with an electroless plating bath and allowing electroless deposition of a conductive material to proceed for a predetermined time to fill the plurality of openings 167 with the conductive material. One skilled in the art understands the composition of the electroless plating bath for copper filling and that it may include, for example a reducing agent, a complexing agent, a source of copper ions, and some additives. In one embodiment, the electroless plating bath includes formaldehyde and EDTA and the conductive material includes one of CuMn, CuCr, CuV, CuTi, and/or CuNb. Thereafter, the substrate is removed from the electroless plating bath. The process of contacting the openings to the electroless plating bath and removing the substrate therefrom is repeated to at least partially fill the openings 167 with a conductive material. As a result of the damascene deposition process 175, a plurality of second conductive layer structures or metal lines 180 are formed in the openings 167. An optional CMP step or similar planarization step could be performed at this juncture as well, e.g., if the openings 167 are overfilled.

Figure 7:
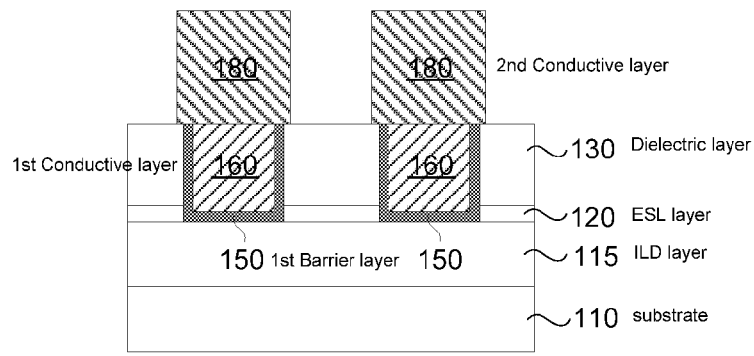

Referring now to FIG. 7, the trench mask layer 170 is removed to leave behind the freestanding conductive layer structures 180 on the substrate, as defined by the openings 167 of the patterned photoresist layer. In an embodiment where the trench mask layer 170 is a patterned photoresist layer, the patterned photo resist layer is removed by stripping. In an exemplary embodiment, the patterned photoresist layer is stripped using a plasma etching process, as is well known in the art. In an alternative embodiment, the patterned photoresist layer is stripped using a wet etch process, as is well known in the art.

Figure 8:
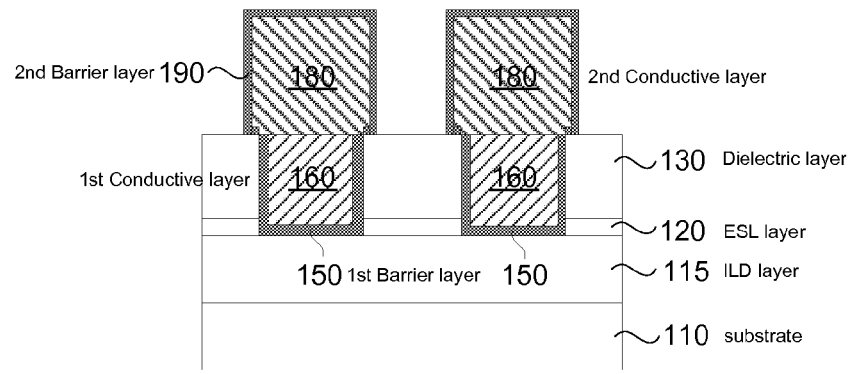

FIG. 8 shows a second barrier layer 190 formed on the top, the sidewalls, and portions of the bottom of the conductive layer structures 180. The second barrier layer 190 includes metals and is electrically conductive but does not permit inter-diffusion and reactions between the conductive layer structures 180 and a dielectric layer to be filled therebetween. In one embodiment, the second barrier layer 190 is a self-forming barrier layer via a metal anneal or a heating process applied to the substrate that wraps over the conductive layer structures 180. The anneal process may be a rapid thermal anneal (RTA), a laser anneal, and/or a flash lamp anneal. In one embodiment, the second barrier layer 190 is self-formed by applying a temperature of from about 200 C to about 400 C to the substrate 110 for a time period of about 1 minute. The anneal process may be conducted in oxygen ambient, a combination of steam ambient and oxygen ambient combined, or under an inert gas atmosphere. In one embodiment where the alloy element in the conductive layer structures 180 is manganese (Mn), with the thermal driving force, Mn segregates from copper and is driven to about the surface of the conductive layer structures 180 where Mn reacts with oxygen to form manganese oxide (MnOx). In other embodiments, the second barrier layer 190 may include CrOx, VOx, TiOx, and/or NbOx; however, the composition depends on the type of copper alloy used in the conductive layer structures 180.

The self-forming barrier layer process will be understood to those skilled in the art. By way of brief review, and without being limited to any particular theory of operation, the process may work as follows. The second conductive layer 180 does not contain pure copper. The second conductive layer 180 contains a copper alloy, where an alloying metal such as Mn is alloyed with Cu. When heat is introduced to the second conductive layer 180, the thermal process segregates the Mn from Cu and drives Mn to the surface of the second conductive layer 180 where it reacts with oxygen to form MnOx.

In another embodiment, the second barrier layer 190 is formed by techniques such as CVD, E-less plating, and ALD, or other suitable techniques. The barrier layer 190 may include nitride (TiN, TaN, TiSiN, TaSiN, SiN, SiCN), metal or alloys (CoWP, CoWB, CoReP, NiWP, NiWB, NiReP, W), or combinations thereof. In some embodiments, the second barrier layer 190 includes multiple films.

Figure 9A:
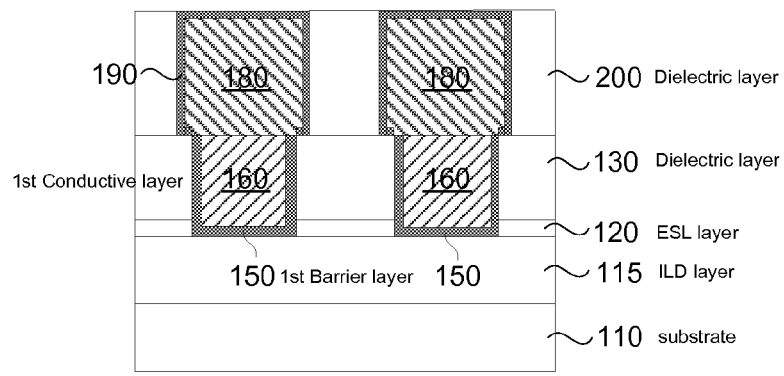
Figure 9B:
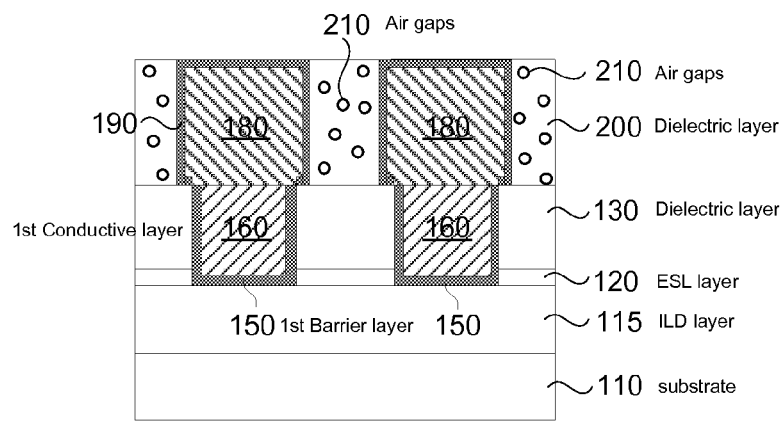

Referring now to FIG. 9A, a dielectric material layer 200 is deposited on the surface of the substrate 110 to fill in regions between the conductive layer structures 180, so as to enclose the conductive layer structures 180. Since the dielectric material layer 200 is formed above the barrier layer 190, diffusion of the copper metal into the dielectric material layer 200 is prevented. The dielectric material layer 200 includes dielectric materials, such as silicon oxide, silicon nitride, a dielectric material having a dielectric constant (k) lower than thermal silicon oxide (thereafter referred to as low-k dielectric material layer), or other suitable dielectric material layer. In various examples, the low k dielectric material may include fluorinated silica glass (FSG), carbon doped silicon oxide, Xerogel, Aerogel, amorphous fluorinated carbon, Parylene, BCB (bis-benzocyclobutenes), polyimide, and/or other materials as examples. In another example, the low k dielectric material may include an extreme low k dielectric material (XLK). A process of forming the dielectric material layer 200 may utilize spin-on coating or CVD. In another embodiment, the dielectric material layer 200 is deposited by a spin-on dielectric (SOD) process to substantially fill in the regions between the conductive layer structures 180.

In one embodiment, the dielectric material layer 200 substantially fills the regions between the conductive layer structures 180. Alternatively, the dielectric material layer 200 disposed between the conductive layer structures 180 includes voids or air gaps 210 (see FIG. 9B) to further reduce the average dielectric constant and increase the isolation efficiency. The air gaps 210 may be formed by choosing and tuning a proper deposition process to form the dielectric material layer 200. As an example, the dielectric material layer 200 is deposited by CVD and the CVD deposition rate is tuned to be high enough such that the dielectric material layer 200 closes up before completely filling in the regions between the conductive layer structures 180, resulting in air gaps 210. In another embodiment, air gaps 210 may be formed by depositing dielectric material layer 200 in a polymer doping process, well-known in the art. By applying a thermal process, such as at a temperature of from 100 C to about 200 C for a time period of about 1 minute to about 5 minutes to the substrate 110, the polymer is removed thereby generating air gaps 210 in its place.

Following the deposition of the dielectric material layer 200 on the surface of the substrate 110, the substrate is planarized to remove excess dielectric material layer 200 to expose the top surface of the conductive layer structures 180, upon which subsequent metallization layers may be formed. Planarization of the substrate may comprise chemical mechanical polishing (CMP) of the substrate.

It will be appreciated that embodiments of method 2 of FIG. 1 may be iteratively performed to form multiple metallization layers one stacked upon another in a back-end-of-the-line stack. It is also understood that the dimensions recited are merely examples, and will change with the down scaling of integrated circuits. It is further understood that the damascene structures shown in FIGS. 2-9 are only for illustrative purpose and are not limiting. Additional embodiments can be conceived.

The embodiments disclosed herein offer advantages over conventional dual damascene methods. It is understood, however, that different embodiments may offer other advantages, and that no particular advantage is required for all embodiments. One advantage is that the embodiments disclosed herein allow high aspect ratio damascene openings to be filled that may otherwise not be properly filled by conventional damascene processes. Electroless bottom-up metal fill process makes gap filling easier. Another advantage is that the processes disclosed herein avoid damages to low k dielectric material layers induced by etching. Still another advantage is that the processes disclosed herein do not require seed layers because electroless bottom-up metal fill process is utilized. Still another advantage is that the processes disclosed herein are compatible with existing semiconductor fabrication flow. Therefore, the embodiments of the present disclosure will not be expensive to implement.

The present disclosure has described various exemplary embodiments. According to one embodiment, a method of forming a metallization layer in a semiconductor substrate includes forming a patterned dielectric layer on a substrate, the patterned dielectric layer having a plurality of first openings. A first conductive layer is formed in the plurality of first openings. A patterned mask layer is formed over portions of the first conductive layer outside the plurality of first openings, the patterned mask layer having a plurality of second openings, wherein at least a subset of the second openings are disposed over the first openings. A second conductive layer is filled in the plurality of second openings, the second conductive layer defining conductive layer structures shaped by the second openings. The patterned mask layer is removed to leave behind the conductive layer structures on the substrate. The substrate is heated to form a self-forming barrier layer on the top and sidewalls of the conductive layer structures.

According to another embodiment, a method of forming a metallization layer, includes forming a plurality of first metal layer structures in a dielectric layer on a semiconductor substrate. A patterned photoresist layer is formed, the patterned photoresist layer having a plurality of openings that define second metal layer structures that are to be formed. At least a subset of the openings are disposed over the plurality of first metal layer structures. A conductive layer is filled in the plurality of openings. The patterned photoresist layer is removed from the substrate to leave second metal layer structures on the dielectric layer. The substrate is thereafter annealed to form a self-forming barrier layer on the top and sidewalls of the second metal layer structures.

According to yet another embodiment, a semiconductor device includes a plurality of first metal layer structures disposed in a dielectric layer on a semiconductor substrate. A plurality of second metal layer structures is disposed on the dielectric layer. Each of the plurality of second metal layer structures are disposed over a respective one of the plurality of first metal layer structures. A barrier layer is disposed on the top and sidewalls of the second metal layer structures. A dielectric material layer is disposed onto the surface of the dielectric layer and in areas between the second metal layer structures.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A method of fabricating a semiconductor device, comprising:
    forming an etching stop layer over a substrate;
    forming a patterned dielectric layer over the etching stop layer, the etching stop layer disposed between the patterned dielectric layer and the substrate, the patterned dielectric layer having a plurality of first openings;
    forming a first conductive layer in the plurality of first openings;
    forming a mask layer over first portions of the patterned dielectric layer disposed outside the plurality of first openings, the mask layer having a plurality of second openings, wherein at least a subset of the second openings are disposed over the first openings;
    filling a second conductive layer in the plurality of second openings, the second conductive layer defining conductive layer structures shaped by the second openings, the conductive layer structures disposed laterally adjacent to the mask layer;
    removing the mask layer laterally adjacent to the conductive layer structures to leave behind the first portions of the patterned dielectric layer and the conductive layer structures on the substrate; and
    after the removing, annealing the conductive layer structures to form a self-forming barrier layer on a top and sidewalls of the conductive layer structures.

2. The method of claim 1, further comprising:
    prior to forming a first conductive layer in the first openings, depositing a diffusion barrier layer on a bottom and sidewalls of the dielectric layer in the plurality of first openings.

3. The method of claim 1, wherein the mask layer comprises a patterned photoresist layer.

4. The method of claim 1, wherein the forming a mask layer is carried out in a manner such that at least some of the second openings are wider than the respective first openings disposed therebelow.

5. The method of claim 1, further comprising after the annealing, depositing a dielectric material layer onto a surface of the substrate in areas between the conductive layer structures and planarizing the substrate to remove excess dielectric material layer to expose the top of the conductive layer structures.

6. The method of claim 1, wherein the second conductive layer includes a material selected from the group consisting of: CuMn, CuCr, CuV, CuTi, and CuNb.

7. The method of claim 1, wherein the filling the second conductive layer in the second openings is carried out by depositing a copper material in an electroless copper bottom-up fill process.

8. The method of claim 1, wherein the self-forming barrier layer includes a material selected from the group consisting of MnOx, CrOx, VOx, TiOx, NbOx, and combinations thereof.

9. The method of claim 1, wherein the self-forming barrier layer includes a material selected from the group consisting of TiN, TaN, TiSiN, TaSiN, SiN, SiCN, CoWP, CoWB, CoReP, NiWP, NiWB, NiReP, W, and combinations thereof.

10. A method of forming a metallization layer, comprising:
    forming a plurality of first metal layer structures in a dielectric layer on a semiconductor substrate;
    prior to forming the plurality of first metal layer structures, depositing a diffusion barrier layer in the dielectric layer that conforms to a bottom and side surfaces of the first metal layer structures;
    forming a patterned photoresist layer over a first surface of the dielectric layer, the patterned photoresist layer having a plurality of openings that define second metal layer structures that are to be formed, wherein at least a subset of the openings are disposed over the plurality of first metal layer structures;
    filling a conductive layer in the plurality of openings, the conductive layer disposed laterally adjacent to the patterned photo resist layer;
    removing the patterned photoresist layer laterally adjacent to the conductive layer from the substrate to expose the first surface of the dielectric layer and to leave second metal layer structures on the dielectric layer and respective first metal layer structures; and
    annealing the substrate to form a self-forming barrier layer on a top and sidewalls of the second metal layer structures.

11. The method of claim 10, further comprising depositing a dielectric material layer onto a surface of the substrate in areas between the second metal layer structures and planarizing the substrate to remove excess conductive material from the second metal layer structures and dielectric material layer to expose a top of the second metal layer structures.

12. The method of claim 10, wherein the conductive layer includes a material selected from the group consisting of: CuMn, CuCr, CuV, CuTi, and CuNb.

13. The method of claim 10, wherein the filling the conductive layer in the plurality of openings is carried out by depositing a copper material in an electroless copper bottom-up fill process.

14. The method of claim 10, wherein the self-forming barrier layer includes a material selected from the group consisting of MnOx, CrOx, VOx, TiOx, NbOx, and combinations thereof.

15. The method of claim 10, wherein the self-forming barrier layer includes a material selected from the group consisting of TiN, TaN, TiSiN, TaSiN, SiN, SiCN, CoWP, CoWB, CoReP, NiWP, NiWB, NiReP, W, and combinations thereof.

16. A method of forming semiconductor device, comprising:
    forming an etching stop layer between a patterned dielectric layer and a semiconductor substrate;
    disposing a plurality of first metal layer structures within the patterned dielectric layer on the semiconductor substrate;
    disposing over each of the plurality of first metal layer structures a second metal layer structure, the second metal layer structures disposed laterally adjacent to a mask layer, the mask layer overlying first portions of the patterned dielectric layer;
    removing the mask layer laterally adjacent to the second metal layer structures to expose a top surface and sidewalls of each second metal layer structure while leaving behind the first portions of the patterned dielectric layer;
    disposing a barrier layer on the exposed top surface and sidewalls of each second metal layer structure; and
    disposing a dielectric material layer onto a surface of the patterned dielectric layer and in areas between the second metal layer structures.

17. The method of claim 16, wherein at least some of the second metal layer structures are formed to be wider than the respective first metal layer structures disposed below.

18. The method of claim 16, further comprising conformally forming a diffusion barrier layer in the patterned dielectric layer conformed to a bottom and side surfaces of the first metal layer structures.

19. The method of claim 16, wherein the barrier layer includes a material selected from the group consisting of MnOx, CrOx, VOx, TiOx, NbOx, and combinations thereof.

20. The method of claim 1, wherein a portion of the self-forming barrier layer is disposed over the patterned dielectric layer.

* * * * *